(12) United States Patent
Ismail et al.

(10) Patent No.: US 7,415,264 B2
(45) Date of Patent: Aug. 19, 2008

(54) LOW NOISE FILTER FOR A WIRELESS RECEIVER

(75) Inventors: Aly Ismail, Newport Beach, CA (US); John E. Vasa, Irvine, CA (US); Balasubramanian Ramachandran, Irvine, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 610 days.

(21) Appl. No.: 10/949,534

(22) Filed: Sep. 25, 2004

(65) Prior Publication Data

US 2006/0068749 A1    Mar. 30, 2006

(51) Int. Cl.
*H04B 1/16* (2006.01)
*H04B 1/10* (2006.01)

(52) U.S. Cl. ............... 455/339; 455/307; 455/324

(58) Field of Classification Search .......... 455/307, 455/296, 306, 324; 333/216, 217
See application file for complete search history.

(56) References Cited

U.S. PATENT DOCUMENTS 4,185,250 A * 1/1980 Regan ................... 330/107
5,854,421 A * 12/1998 Yamamoto ................ 73/1.88
2002/0160734 A1 10/2002 Li et al.
2004/0043744 A1 3/2004 Schlegel et al.

OTHER PUBLICATIONS

Zoran Skrba and Thomas J. Brazil; System Level Modelling of Wireless Communication Systems Using A Power Amplifier Behavioural Model; Joint IEI/IEEE Symposium on Telecommunication Research; Nov. 27, 2001; pp. 1-7.
Massara, R.E. Steadman, J.W., Wilamowski, B.M., Svoboda, J.A.,; Active Filters; The Electical Engineering Handbook; Boca Raton: CRC Press LLC, 2000; Chapter 29.

* cited by examiner

*Primary Examiner*—Lee Nguyen (57) ABSTRACT

A low noise filter is arranged to receive an input signal from a downconverter. The low noise filter is constructed to block or cancel any DC offset in the input signal, as well as filter selected frequency components from the input signal. The low noise filter uses a shared capacitor both to handle the DC offset and to set filter response characteristics. As the low noise filter is implemented with a Frequency Dependent Negative Resistance (FDNR) device, the shared capacitor may be relatively small. The low noise filter has a load capacitor, with the output of the load capacitor coupled to a bias resistor and voltage. This bias structure cooperates with the load capacitor to set a high cutoff frequency for the low noise filter useful for blocking or canceling the DC offset.

22 Claims, 8 Drawing Sheets

82 — DEFINE A PASSIVE FILTER NETWORK HAVING A LOAD RESISTANCE AND AN INDUCTOR

84 — TRANSFORM THE PASSIVE NETWORK INTO AN ACTIVE FILTER USING IMPEDANCE SCALING

85 — IMPLEMENT THE LOAD RESISTANCE AS A LOAD CAPACITANCE, AND THE INDUCTOR AS A FREQUENCY DEPENDENT NEGATIVE RESISTANCE (FDNR)

87 — INSERT A BIAS RESISTANCE BETWEEN THE LOAD CAPACITANCE AND THE FDNR

88 — SET BIAS VOLTAGE ACCORDING TO HIGH-PASS CUTOFF REQUIREMENT

FIG. 7

92 — RECEIVE A LOW/ZERO IF SIGNAL HAVING A DC OFFSET

94 — PROVIDE AN ACTIVE FILTER WITH A FREQUENCY DEPENDENT NEGATIVE RESISTANCE (FDNR)

95 — BIAS THE LOAD CAPACITANCE OF THE FDNR TO SET A HIGH CUT-OFF FREQUENCY

97 — USE THE CAPACITORS OF THE ACTIVE FILTER TO BLOCK DC OFFSET

98 — PASS THE LOW/ZERO IF SIGNAL WITH MINIMAL FILTER NOISE

LOW NOISE FILTER FOR A WIRELESS RECEIVER

BACKGROUND

This application is related to U.S. patent application Ser. No. 10/715,631, filed Nov. 18, 2003 and entitled "Low-Noise Filter for a Wireless Receiver", and to U.S. patent application Ser. No. 10/725,767, filed Dec. 2, 2003, and entitled "DC Offset Cancellation in a Wireless Receiver", both of which are incorporated herein by reference.

The field of the present invention is electronic circuits for active filtering. More particularly, the present invention relates to low-noise filters.

Wireless communication systems generally transmit a modulated radio frequency (RF) signal that is converted to a baseband signal in a receiver. A conventional receiver does this conversion in a two-stage process. In a first stage, the RF signal is down converted to an intermediate frequency (IF) signal, and then in a second stage, the IF signal is further down converted to the baseband frequency. This process enables simplified filtering and processing, but the two-stage architecture consumes valuable space and power in wireless devices. Accordingly, a newer single-stage architecture is being deployed. This single-stage architecture converts the RF signal directly to the baseband signal, and is typically referred to as direct conversion receiver (DCR) structure. As an alternative, some of the benefits of the DCR structure may be realized using a low IF architecture, while retaining some of the simplified filtering and processing of the IF structure. A low IF receiver converts a radio frequency (RF) signal to an intermediate frequency that is lower than the IF of a conventional receiver.

The direct conversion receiver downconverts a radio frequency (RF) signal directly to baseband (DC) without first converting the RF signal to an intermediate frequency (IF). One of the benefits of a direct conversion receiver is the elimination of costly filter components used in systems that employ an intermediate frequency conversion. For example, in a conventional code division multiple access (CDMA) communication system, one or more surface acoustic wave (SAW) filters are implemented to aid in filtering the desired channel. To further complicate the circuitry, these SAW filters are typically located on a different device (i.e., "off-chip") than many of the receiver components.

A low IF or a direct conversion receiver allows the filter components to be implemented using electronic circuitry that can be located on the same device (i.e., "on-chip") as many of the receiver components. In a direct conversion receiver implementation, high-order (e.g., fifth-order or higher) active filters are used to attenuate the interferers before the baseband chip. Unfortunately, because the filters are implemented using electronic circuitry on the same chip as the receiver components, the filters add significant noise to the received signal. The added noise reduces the sensitivity of the receiver, thereby making such an active filter challenging to implement.

Noise contributed by a filter to the received signal can be defined by the equation Noise=kT/C (Equation 1), where k is a constant, T=temperature, and C=capacitance. From equation 1 it is clear that the noise is inversely proportional to the capacitance. To reduce the noise, the capacitance values are typically made large. Unfortunately, increasing the capacitance consumes valuable area on the integrated circuit (IC) on which the receiver is fabricated. The space required for these capacitors substantially increases the overall size for the receiver IC, as the filter capacitors typically represent the largest block on the IC.

When implementing a low IF or a direct conversion receiver, there is typically some amount of offset (referred to as "DC offset") that appears on the downconverted baseband signal. The DC offset occurs due to filter or front-end mismatch and also due to self-mixing that can occur with the local oscillator (LO) signal, the radio frequency (RF) signal or interfering signals in the receiver. Typically, filter and front-end mismatch due to temperature change over time results in static DC offset. Self-mixing among the LO, RF and interfering signals, as well as reflection at the antenna, temperature variation and LO leakage result in dynamic DC offset. Correction for DC offset is typically performed on the baseband amplifier located in the receiver. Many techniques have been proposed to minimize DC-offset. For example, it is possible to minimize DC offset using digital calibration techniques in the analog-to-digital converter (A/D) located in the receiver. Alternately, sampling techniques and Sample-and-Hold (S/H) circuits have been used to subtract the estimated offset of the variable gain amplifier from the received signal.

Unfortunately, one or all of these techniques can only be applied to a system in which the receiver does not continuously operate, such as in a TDMA communication system. In a CDMA system, these techniques will not be effective because the receiver works continuously with no interruption. Furthermore, DC-offset correction using so called "auto-zeroing" techniques during start-up is not practical in a CDMA system because of dynamic offsets. In a CDMA system the only option that shows promise is the implementation of a so called "servo-loop" like architecture around the variable gain amplifier.

In a servo-loop architecture, the high pass cut-off frequency is dependent upon the gain characteristics of the variable gain amplifier and the amplifiers in the servo-loop. Because the transconductance of the variable gain amplifier varies significantly with the applied gain control signal (usually above 50 dB of range), the cut-off frequency varies by more than 50 dB, which places the cut-off frequency at a point at which data carried in the received signal will likely be lost. It is possible to adjust the high pass cut-off frequency by varying the gain of the amplifiers in the servo-loop inversely proportional to the transconductance amplification of the VGA. Since the transconductance amplification of the VGA varies proportionally to the exponential of the control voltage, the amplification of the amplifiers in the servo-loop must vary with the inverse of the exponential of the control voltage. Unfortunately, such a servo-loop increases significantly the complexity, power consumption and the area on the device occupied by the architecture.

Therefore, it would be desirable to minimize the amount of noise contributed to a received signal by filter components in a direct conversion receiver, while maximizing receiver sensitivity. It is also desirable to minimize the amount of area on a device consumed by the filter components, especially capacitor devices. It would also be desirable to efficiently provide DC offset cancellation in a wireless receiver operating in a communication system in which the receiver operates continuously.

SUMMARY

Briefly, the present invention provides a low noise filter arranged to receive an input signal from a downconverter. The low noise filter is constructed to block or cancel any DC offset in the input signal, as well as filter selected frequency components from the input signal. The low noise filter uses a shared capacitor structure both to handle the DC offset and to set filter response characteristics. Since the low noise filter is implemented with an Frequency Dependent Negative Resistance (FDNR) device, the shared capacitor structure may be relatively small. The low noise filter has a load capacitor, with the output of the load capacitor coupled to a bias resistor and voltage. This bias structure cooperates with the load capacitor to set a high cutoff frequency for the low noise filter useful for blocking or canceling the DC offset.

In one example, the low noise filter is used in a wireless receiver for a CDMA compliant system. The receiver uses an antenna to receive an RF signal, and uses as downconverter and local oscillator to generate an unfiltered baseband signal. The unfiltered baseband signal is provided to the low noise filter, where the low noise filter cancels or blocks DC offset in the baseband signal, as well as provides a frequency filtering function compliant with CDMA operational requirements. The low noise filter has a load capacitor that is shared between the filtering function as well as the DC offset function. Also, in one embodiment, the low noise filter is implemented with a Generalized Impedance Converter (GIC)device, so the shared capacitor structure is relatively small, while still providing excellent noise characteristics. Accordingly, the low noise filter not only uses a relatively small capacitor structure, but uses that same capacitor structure to also block or cancel DC offset.

Advantageously, the low noise filter may be constructed with relatively small capacitors, enabling a receiver module to be more efficiently built and operated. Further, since the low noise filter also acts to block or cancel DC offset, the receiver module does not need additional structure or operating resources to handle DC offset. Thereby, the low noise filter enables the receiver module to be fabricated in a much smaller size, while maintaining superior operational characteristics.

BRIEF DESCRIPTION OF THE DRAWINGS

The invention can be better understood with reference to the following figures. The components within the figures are not necessarily to scale, emphasis instead being placed upon clearly illustrating the principles of the invention. Moreover, in the figures, like reference numerals designate corresponding parts throughout the different views. It will also be understood that certain components and details may not appear in the figures to assist in more clearly describing the invention.

DETAILED DESCRIPTION

Figure 1:
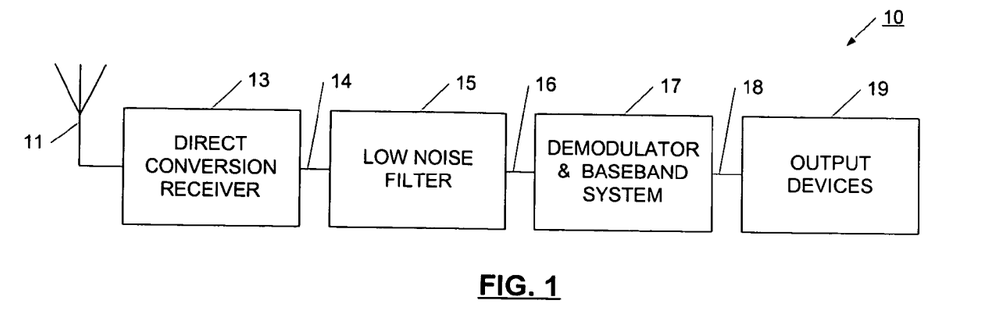
FIG. 1 is a simplified block diagram of a wireless receiver having a low noise filter in accordance with the present invention.

Referring now to FIG. 1, a simplified receiver 10 is illustrated. Receiver 10 receives a radio frequency (RF) signal at antenna 11. The antenna 11 provides the RF signal to a direct conversion receiver (DCR) 13, where the RF signal is downconverted to a direct conversion signal 14. This direct conversion signal 14 contains baseband signal information, but higher frequency components need to be filtered. Also, the direct conversion signal may have an undesirable DC offset component. The direct conversion signal 14 is received directly into the low noise filter 15. The low-noise filter has been designed to have an active filter component with reduced capacitor requirements as compared to conventional low noise filters. In this way, the low noise filter 15 may be implemented in a smaller area, saving valuable space on the receiver integrated circuit. Importantly, the DC offset does not need to be removed before the signal 14 is received into the low noise filter 15. Instead, the low noise filter 15 both removes the DC offset and filters the signal 14. The low noise filter 15 provides a baseband signal 16 to the demodulator and baseband system 17, where the baseband signal 16 is further processed into information signals 18. These information signals are then useful to drive output devices 19 such as a speaker or data display.

Advantageously, the receiver 10 has a low noise filter 15 that provides superior rejection and noise qualities while using relatively small capacitors. Further, because the low-noise filter also rejects DC offset components, the receiver 10 does not need a separate structure to handle DC offset. Thereby, the low noise filter 15 enables the receiver 10 to be fabricated in a much smaller size, while maintaining superior operational characteristics.

The receiver described herein will generally be discussed with reference to code division multiple access (CDMA) standards such as IS95/A/B, IS2000, and WCDMA, but it will be appreciated that the receiver and low noise filter may be modified to support other access standards such as Global System for Mobile communication (GSM) or emerging and evolving standards. Also, although the receiver may be illustrated with a direct conversion receiver, it will be understood that the low-noise filter can be advantageously implemented in communication devices employing a low IF receiver. The receiver may also be used as part of a mobile wireless device, or may be implemented in a basestation or other wireless infrastructure equipment.

The hardware implementation of the low-noise filter can include any or a combination of the following technologies, which are all well known in the art: discrete electronic components, a discrete logic circuit(s) having logic gates for implementing logic functions upon data signals, an application specific integrated circuit having appropriate logic gates, a programmable gate array(s) (PGA), a field programmable gate array (FPGA), etc.

The software for the low-noise filter comprises an ordered listing of executable instructions for implementing logical functions, and can be embodied in any computer-readable medium for use by or in connection with an instruction execution system, apparatus, or device, such as a computer-based system, processor-containing system, or other system that can fetch the instructions from the instruction execution system, apparatus, or device and execute the instructions.

Figure 2:
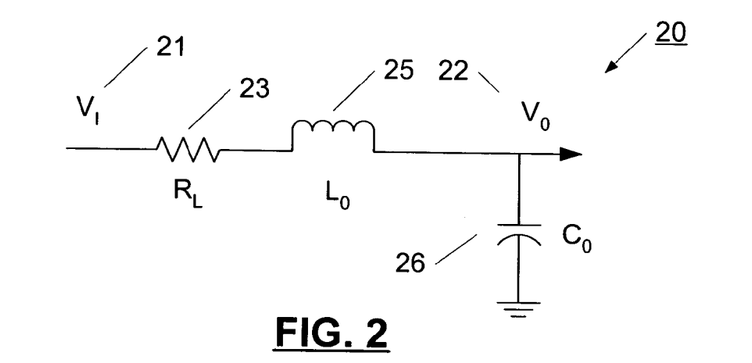
FIG. 2 is a circuit diagram of a passive filter network.

Referring now to FIG. 2, a process of designing a low-noise filter will be described. A low-noise filter, similar to the low noise filter 15 described with reference to FIG. 1, generally is designed to have a network response that passes specific bandwidths and rejects other bandwidths. The desired network response results from the operating frequencies and requirements for a specific wireless communication standard. This network response is often expressed as a voltage or current transfer function, as will be understood by one skilled in the art of filter design. Filters may be constructed using only passive devices, or may be constructed using active devices. Both the passive filter and the active filter may be designed to have a similar transfer function, so other design choices dictate whether a particular application uses passive or active filters. A passive filter is one that uses only passive devices such as resistors, capacitors, and inductors. Due to limitations and the difficulty of integrating large passive inductors on-chip, active filters replace inductive elements with active devices such as an op amps or transistors, for example. However, for simplicity, it is desirable to first consider the network response of a low noise filter using an arrangement of passive devices. FIG. 2 shows a simple passive filter 20 that has a resistor 23 in series with an inductor 25. A capacitor 26 couples the inductor 25 to ground. An input signal 21 is received by the passive filter, which passes and rejects particular frequencies depending on the values selected for the resistor 23, inductor 25, and capacitor 26. The relationship between the input signal 21 and the filtered signal 22 is often referred to as the transfer function or network response for the filter. It will be understood that the filter of FIG. 2 is a highly simplified filter, and that more complex filters generally will be required for use as an operational low-noise filter. However, general filter synthesis and design is well known, so will not be addressed in detail. For example, see Massara, Steadman, Willamowske, and Svoboda, *The Engineering Handbook* (CRC Press 2000), describe processes for designing passive and active filters.

Once the filter response of the passive filter is correct for the selected application, the filter may be converted to an active filter. In one example, the passive filter of FIG. 2 is converted to an active filter using a Bruton Transformation process. The Bruton Transformation applies a complex impedance scaling to each of the impedance components in the passive filter. A designer selects and applies specific scaling factors to determine the specific component values in the resulting active filter. For example, the designer may apply a scaling consent that reduces the size of capacitors, which is desirable for a low-noise filter for a wireless receiver. The Bruton Transformation is well understood, and will not be described in detail. For example, see Bruton, *RC-Active Circuits*, (Prentice-Hall 1981).

Figure 3:
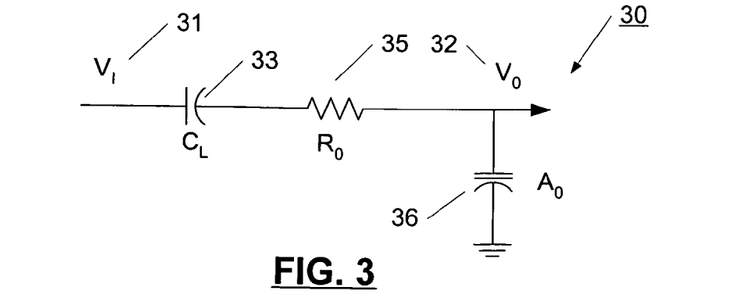
FIG. 3 is a circuit diagram of a low-noise filter.

Generally, a Bruton Transformation does not change the filtering transfer function for a passive filter, but converts resistors into capacitors, inductors into resistors, and capacitors into "super capacitors". FIG. 3 shows an active filter 30 converted from of the passive filter 20 of FIG. 2. More particularly, the passive filter 20 of FIG. 2 was converted to an active filter 30 using a Bruton transformation. Accordingly, the filtering transfer function for the active filter 30 of FIG. 3 is the same as the passive filter 20 of FIG. 2. Due to the impedance scaling and conversion of the Bruton transform, the resistor 23 has been converted into capacitor 33, the inductor 25 has been converted into resistor 35, and the capacitor 26 has been converted into super capacitor 36. In one embodiment, the "super capacitor" 36 may be implemented as a Frequency Dependent Negative Resistance (FDNR) device. In practice, an FDNR is usually realized by an RC-active subnetwork using op amps, normally two per FDNR. For example, an FDRN may be implemented using a Generalized Impedance Converter (GIC), as described later with reference to FIG. 5.

Active filters implementing a GIC, such as active filter 30 of FIG. 3, have been found to exhibit superior noise qualities and therefore are well suited for use in a wireless receiver. It will be understood that the specific filter topology and component size will be selected to satisfy particular application needs and design consideration. With proper impedance scaling, the active filter 30 may be implemented using relatively small physical capacitors. In this way, the active filter 30 may be constructed using less space on an IC as compared to known low-noise filters. Referring again to FIG. 2, the passive filter 20 was selected to have a load resistance 23, which was converted into a load capacitance 33 through a Bruton transformation. Although it is generally true that a Bruton transformation maintains the transfer function for a filter, in practice the Bruton transformation generally causes a singularity in the input signal to the output signal at DC (frequency=0). This singularity is typically viewed as a circuit limitation by a designer, and is often accounted for using additional circuitry or applying operational limits.

Figure 4:
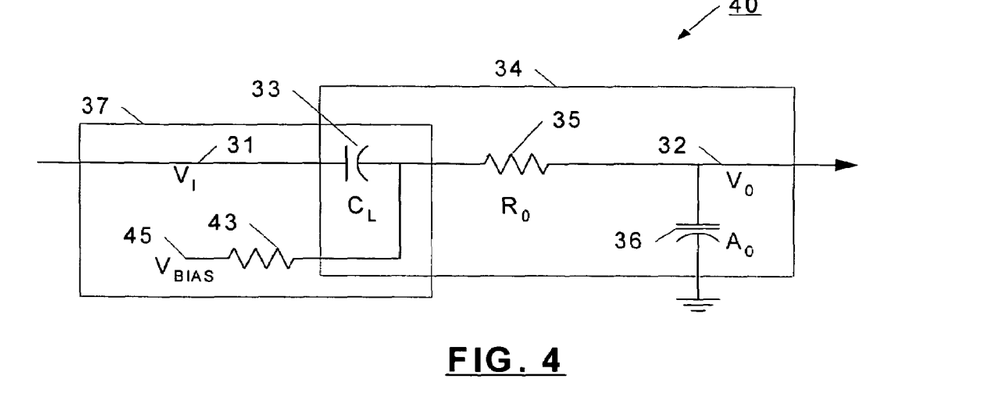
FIG. 4 is a is a circuit diagram of a low-noise filter in accordance with the present invention.

However, as shown in FIG. 4, this usually undesirable singularity may be exploited by filter 40 to block or cancel any DC offset in the input signal. The low-noise filter 40 includes a bias resistor 43 coupled to the output of the load capacitor 33. A bias voltage 45 is used to bias the active network in the FDNR 36, which acts to set a high-pass cutoff frequency. In this arrangement, the low-noise filter 40 has blocking circuitry 37 that cooperates with other elements to block or cancel any DC offset in the signal path. The low noise filter also implements filtering circuitry 34 for implementing a specific transfer function for the filter. The load capacitor 33 has a shared function as a component in the blocking circuitry 37 and as well as being a component in the filtering circuitry 34. In this way, the low noise filter 40 enables a particularly efficient physical arrangement using relatively small capacitors. Since the low-noise filter handles any DC offset, a receiver using low-noise filter 40 does not require additional structure, circuits, or software to overcome the difficulties of a DC offset.

Figure 5:
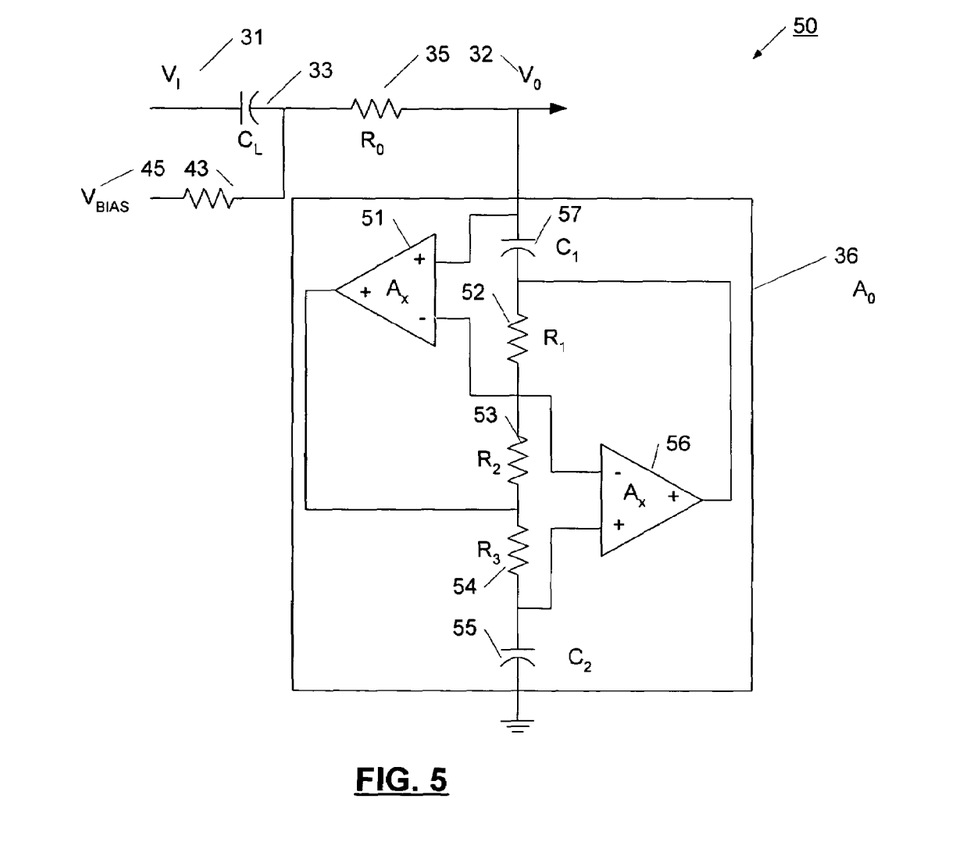
FIG. 5 is a is a circuit diagram of a low-noise filter in accordance with the present invention.

FIG. 5, shows the active filter 50 with the FDNR implemented as a GIC. The GIC implementation of the FDNR 36 includes a pair of operational amplifiers (op-amps) 51 and 56, and related capacitances and resistances. The non-inverting input of the operational amplifier 51 is coupled to the capacitance $C_1$ 57, while the inverting input of the operational amplifier 51 is coupled to the inverting input of the operational amplifier 56. The non-inverting input of the operational amplifier 56 is coupled to the node between the capacitance $C_2$ 55 and the resistance $R_3$ 54. The output of the operational amplifier 51 is coupled to the node between the resistances $R_2$ 53 and $R_3$ 54. The output of the operational amplifier 56 is coupled to the node between the capacitance $C_1$ 57 and the resistance $R_1$ 52. It will be understood that the GIC may be implemented using other circuit arrangements.

Figure 6:
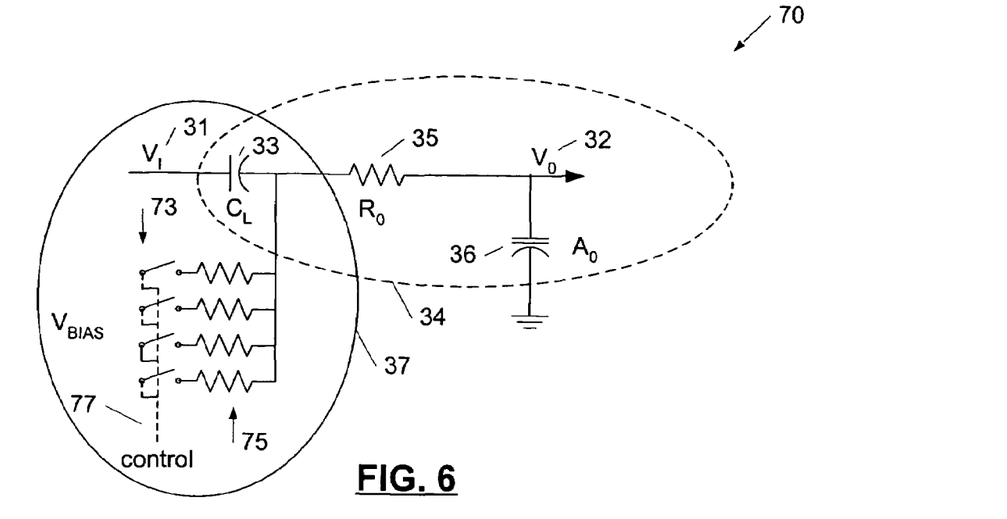
FIG. 6 is a is a circuit diagram of a low-noise filter in accordance with the present invention.

The cutoff frequency is generally a function of the value of the load capacitor, the bias resistor, and the bias voltage. As shown in FIG. 6, a bank of bias resistors 75, responsive to a control input 77, may be selectively inserted into the circuit using switches 73. In this way, the cutoff and response characteristics may be changed during operation of the filter 70.

For example, it may be desirable to use a different bias resistance when first activating the filter 70 to facilitate faster settling. As the filter 70 settles, the bias resistance may be selected and changed to enable better performance characteristics, such as lower noise and better DC blocking. The control signal 77 is preferably generated by the processor or logic device managing the baseband circuitry, so is able to adjust the filter according to the requirements of the baseband system.

Figure 7:
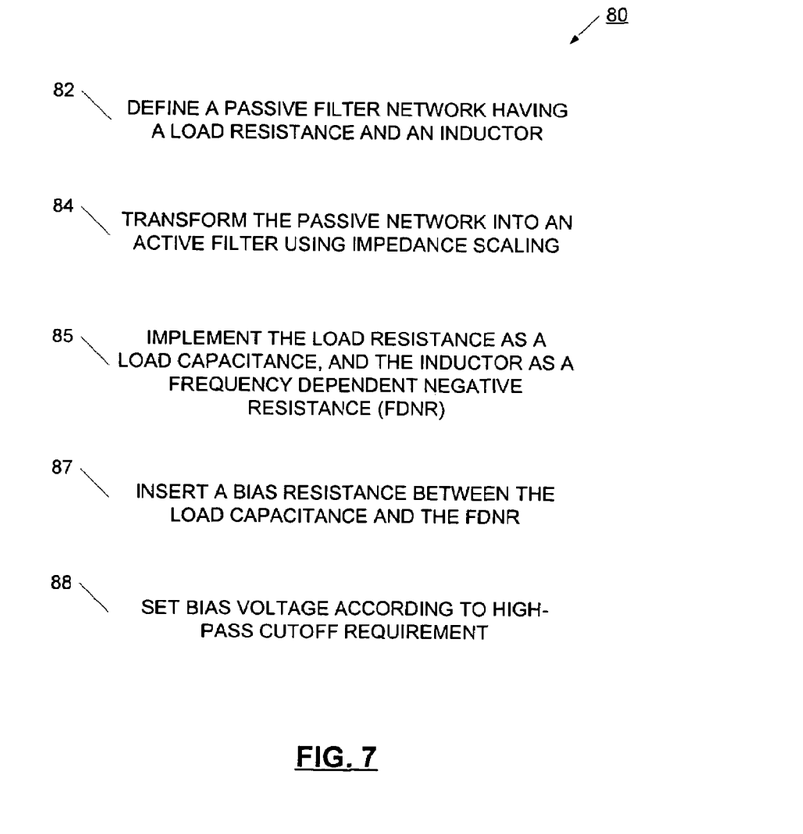
FIG. 7 is a flowchart of a filtering process using a low-noise filter in accordance with the present invention.

Referring now to FIG. 7, a design process 80 is illustrated. The design process 80 is useful for designing and implementing an active filter, particularly a low-noise filter for a wireless receiver. A designer first defines a passive filter structure using conventional processes, as shown in block 82. The designer considers the communication standard to be implemented, device characteristics, and selects a filter topology and component values to implement the selected design. In making the topology and value tradeoffs, the designer generally selects a design that has a known load resistance and has an inductance value coupled to ground.

Using a Bruton transform, the designer converts the passive filter into an active filter as shown in block 84. In performing the Bruton transform, the designer must choose a scaling factor or other constants to apply in the transform. By carefully selecting constant values, the designer is able to adjust the resulting converted values to meet specific design goals. For example, capacitors in a wireless receiver typically dominate the space on the integrated circuit. Accordingly, the designer may select a constant that reduces the capacitance requirements of the active filter to permit smaller capacitor structures. In applications where capacitor space is not important, the designer may choose and implement other design goals. As a result of the Bruton transformation, the load resistance has been converted into a load capacitance, and the grounded capacitor has been converted into a frequency dependent negative resistance device, as shown in block 85. In one example, the FRNR is implemented as a GIC, which has superior noise characteristic. As a result, the active filter has excellent rejection characteristics along with minimal injected noise. Accordingly, a low-noise filter designed according to method 80 is well suited for use in a wireless receiver.

The low-noise filter may also be arranged to block or cancel any DC offset in the input signal to the filter. As shown in block 87, a bias resistor is coupled to the output of the load capacitor, which when properly biased, sets an appropriate high-pass cutoff frequency for the active filter. When biased as shown in block 88, the active filter blocks or cancels DC offset. More particularly, the load capacitor of the active filter is used to set a desired frequency response for the active filter, and also to block DC offset. An active filter designed according to design method 80 has relatively small capacitor requirements to satisfy low noise requirements. Additionally, the filter capacitors also perform the DC blocking function, so separate blocking capacitors or other structure is not needed. A filter designed according to method 80 has excellent noise characteristics, relatively small capacitor requirements, and no added structure for handling DC offset.

Figure 8:
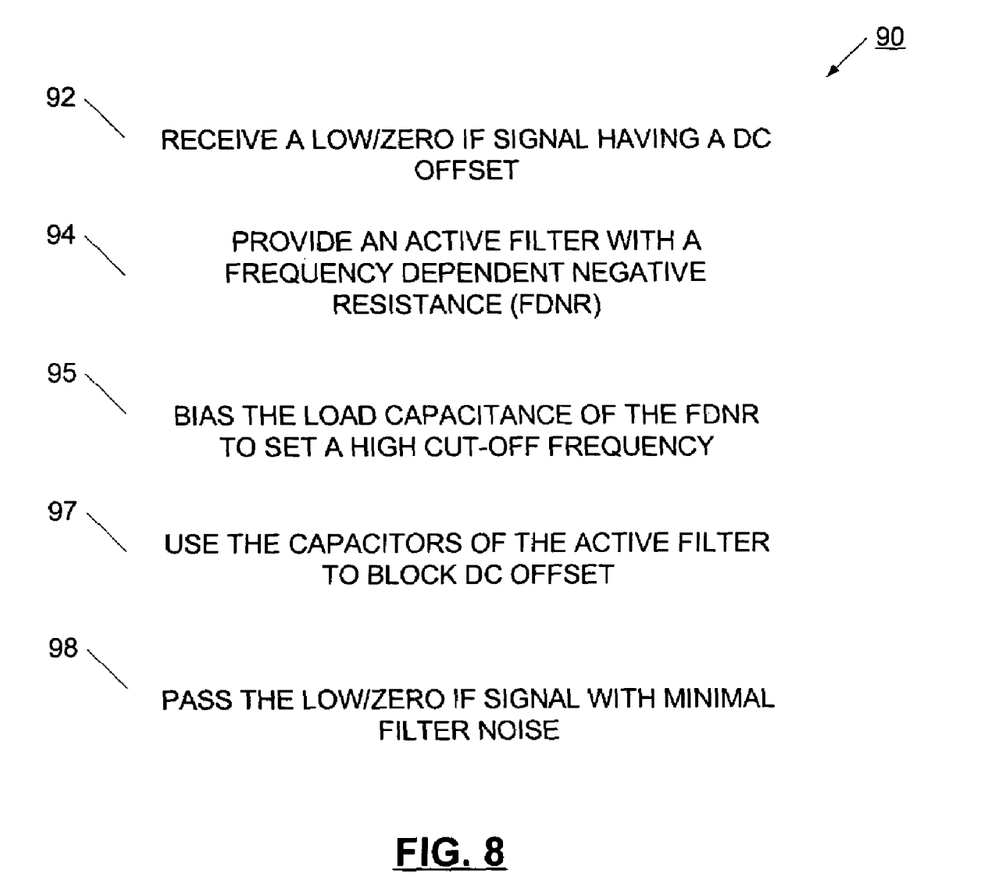
FIG. 8 is a is a flowchart of a design process for a low-noise filter in accordance with the present invention.

Referring now to FIG. 8, a filter process 90 is illustrated. Process 90 uses an active filter designed according to the design process 80 discussed with reference to FIG. 7. In method 90, an unfiltered baseband signal is received from a downconverter as shown in block 92. The baseband signal has baseband information, but needs to be filtered to remove higher frequency components. Also, it is likely the baseband signal has a DC offset, which may vary over time and temperature. If not removed or blocked, the DC offset can cause amplifiers and components in the signal path to saturate or otherwise under perform. The baseband signal is received into an active filter as shown in block 94. The active filter has been designed with an FDNR, which preferably has been implemented using a GIC component structure. In this way, the active filter has superior rejection and noise characteristics. Also, the GIC structure enables relatively small physical capacitors to be used.

Block 95 shows that a bias voltage may be used to bias a bias resistor and the active filter, thereby setting a high-pass cutoff frequency for the filter. By setting an appropriate high-pass cutoff frequency, the filter capacitors act to block or cancel the DC offset component in the input baseband signal. Since the same capacitors are used to block or cancel the DC offset, no additional physical structure is needed to handle the DC offset, enabling a highly compact physical layout for the low-noise filter. After the baseband signal is filtered and the DC offset blocked, the informational portion of the baseband signal is provided to a demodulator or other baseband circuitry, as indicated in block 98.

Figure 9:
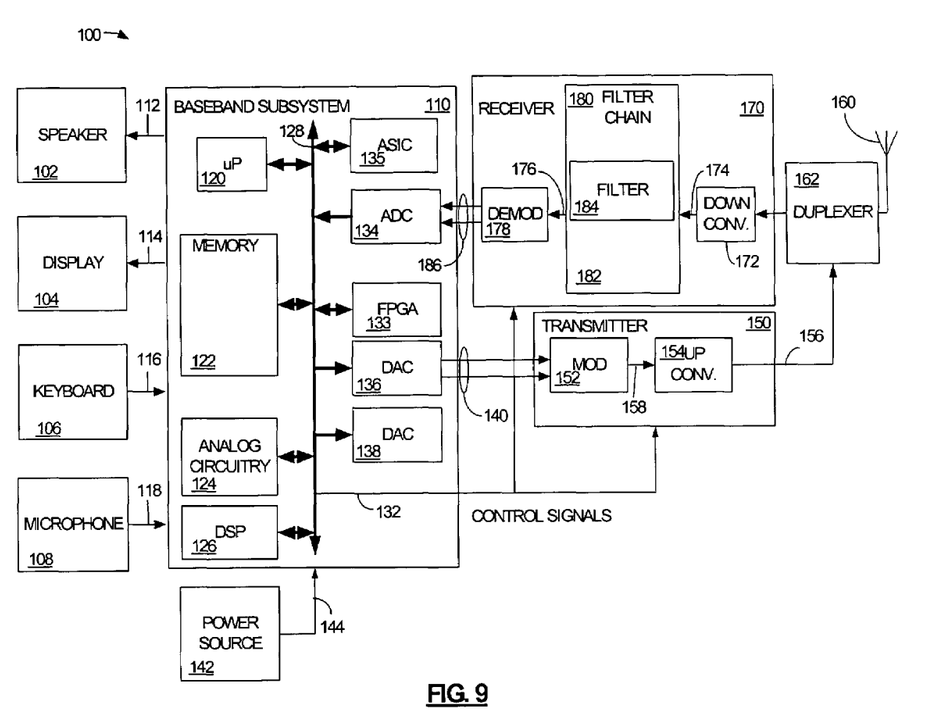
FIG. 9 is a block diagram illustrating a simplified portable transceiver including a low noise filter in accordance with the present invention.

FIG. 9 is a block diagram illustrating a simplified portable transceiver 100 including a low-noise filter for a direct conversion receiver. Portable transceiver 100 includes speaker 102, display 104, keyboard 106, and microphone 108, all connected to baseband subsystem 110. A power source 142, which may be a direct current (DC) battery or other power source, is also connected to the baseband subsystem 110 via connection 144 to provide power to the portable transceiver 100. In a particular embodiment, portable transceiver 100 can be, for example but not limited to, a portable telecommunication handset such as a mobile cellular-type telephone. Speaker 102 and display 104 receive signals from baseband subsystem 110 via connections 112 and 114, respectively, as known to those skilled in the art. Similarly, keyboard 106 and microphone 108 supply signals to baseband subsystem 110 via connections 116 and 118, respectively. Baseband subsystem 110 includes microprocessor (uP) 120, memory 122, analog circuitry 124, and digital signal processor (DSP) 126 in communication via bus 128. Bus 128, although shown as a single bus, may be implemented using multiple busses connected as necessary among the subsystems within baseband subsystem 110.

In one embodiment, depending on the manner in which the low-noise filter to be described below is implemented, the baseband subsystem 110 may also include an application specific integrated circuit (ASIC) 135 and a field programmable gate array (FPGA) 133. Microprocessor 120 and memory 122 provide the signal timing, processing and storage functions for portable transceiver 100. Analog circuitry 124 provides the analog processing functions for the signals within baseband subsystem 110. Baseband subsystem 110 provides control signals to transmitter 150 and receiver 170 via connection 132. Although shown as a single connection 132, the control signals may originate from the DSP 126, the ASIC 135, the FPGA 133, or from microprocessor 120, and are supplied to a variety of connections within the transmitter 150 and the receiver 170. It should be noted that, for simplicity and to facilitate clear understanding, only the basic components of portable transceiver 100 are illustrated. The control signals provided by the baseband subsystem 110 control the various components within the transmitter 150 and the receiver 170.

If the low-noise filter control is implemented using software that is executed by the microprocessor 120, the memory 122 will also include low-noise filter control software, for example, to adjust filter characteristics during the activation process. The low-noise filter software may comprises one or more executable code segments that can be stored in the memory and executed in the microprocessor 120. Alternatively, the functionality of the low-noise filter software may have be coded into the ASIC 135 or can be executed by the FPGA 133. Because the memory 122 can be rewritable and because the FPGA 133 is reprogrammable, updates to the low-noise filter software can be remotely sent to and saved in the portable transceiver 100 when implemented using either of these methodologies.

Baseband subsystem 110 also includes analog-to-digital converter (ADC) 134 and digital-to-analog converters (DACs) 136 and 138. Although DACs 136 and 138 are illustrated as two separate devices, it is understood that a single digital-to-analog converter may be used that performs the function of DACs 136 and 138. ADC 134, DAC 136 and DAC 138 may also communicate with microprocessor 120, memory 122, analog circuitry 124 and DSP 126 via bus 128. DAC 136 converts the digital communication information within baseband subsystem 110 into an analog signal for transmission to a modulator 152 via connection 140. Connection 140, while shown as two directed arrows, includes the information that is to be transmitted by the transmitter 150 after conversion from the digital domain to the analog domain.

The transmitter 150 includes modulator 152, which modulates the analog information in connection 140 and provides a modulated signal via connection 158 to upconverter 154. The upconverter 154 transforms and amplifies the modulated signal on connection 158 to an appropriate transmit frequency and power level for the system in which the portable transceiver 100 is designed to operate. Details of the modulator 152 and the upconverter 154 have been omitted for simplicity, as they will be understood by those skilled in the art. For example, the data on connection 140 is generally formatted by the baseband subsystem 110 into in-phase (I) and quadrature (Q) components. The I and Q components may take different forms and be formatted differently depending upon the communication standard being employed. The upconverter 154 supplies the upconverted signal via connection 156 to duplexer 162. The duplexer 162 comprises a filter pair that allows simultaneous passage of both transmit signals and receive signals, as known to those having ordinary skill in the art. The transmit signal is supplied from the duplexer 164 to the antenna 160.

A signal received by antenna 160 will be directed from the duplexer 162 to the receiver 170. The receiver 170 includes a downconverter 172, a low-noise filter chain 180, and a demodulator 178. The downconverter 172 includes a low-noise amplifier (LNA) (not shown) and circuitry (not shown) to convert the received signal from an RF level to a baseband signal. The baseband signal is sent to the low-noise filter chain 180 via connection 174. The low-noise filter chain comprises at least one filter stage having a low noise filter in accordance with the present invention. The low-noise filter cancels any DC offset, and filters the baseband signal according to a desired transfer function. It will be understood that the filter chain may include one or more isolation devices such as isolation amplifiers to remove or reduce the effects of loading between filter stages. After filtering, the demodulator 178 recovers the transmitted analog information and supplies a signal representing this information via connection 186 to ADC 134. ADC 134 converts these analog signals to a digital signal at baseband frequency and transfers the signal via bus 128 to DSP 126 for further processing.

Figure 10:
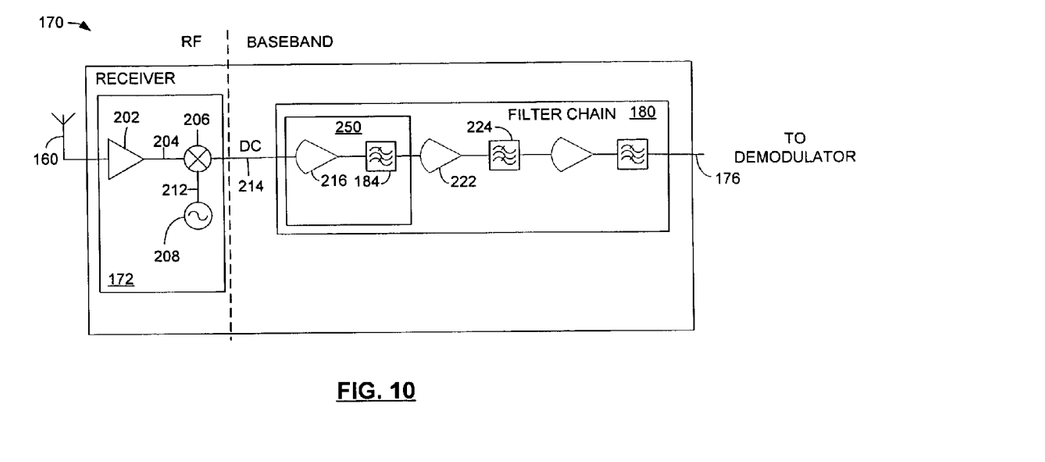
FIG. 10 is a block diagram of a receiver section of the device of FIG. 9.

FIG. 10 is a block diagram illustrating, in greater detail, the receiver 170 of FIG. 9. The receiver 170 receives a signal via antenna 160, which supplies the received signal at an RF frequency level via the duplexer (not shown) to low noise amplifier (LNA) 202. The LNA 202 amplifies the received signal and provides the amplified signal on connection 204 to the mixer 206. The mixer 206 receives a frequency reference signal, also called a "local oscillator" signal, or "LO," from a synthesizer 208, via connection 212. The LO signal determines the frequency to which the mixer 206 downconverts the signal received from LNA 202 via connection 204. In the case of a direct conversion receiver, the mixer 206 downconverts the received RF signal to an unfiltered baseband signal on connection 214.

The baseband signal on connection 214 may contain an undesirable DC offset. The baseband signal on connection 214 is then received at the low-noise filter chain 180. The low-noise filter chain 180 comprises at least one filter stage 250. The filter stage 250 is shown to include the low-noise filter 184 and an isolation amplifier 216. The low-noise filter 184 is designed and constructed according to the process described in FIG. 7. Typically, the process results in a filter arrangement that can be referred to as a so-called "bi-quad" filter because of it's configuration to generate complex poles and zeros. Although illustrated using a plurality of amplifiers and filters, the low-noise filter chain 180 may comprise a single filter stage, depending upon the specific application in which the receiver 170 is used. The general filter design of FIG. 10 shows filter stages separated by isolation devices. It will be appreciated that the filter chain 180 may alternatively be designed as a ladder filter with loading between stages, with component values selected to account for the loading.

The unfiltered baseband signal on connection 214 may be provided to isolation amplifier 216, if present. The isolation amplifier 216 isolates the low noise filter stage 184 from loading effects due to other circuitry, for example, the downconverter 172, and the isolation amplifier 216 supplies the isolated signal to the low-noise filter stage 184. The low-noise filter 184 blocks any DC offset, and also filters the signal to provide the desired signal output. If the low-noise filter chain 180 includes additional filter stages, then the output of the filter 184 is supplied to a subsequent isolation amplifier 222 (if present) and filter stage 224. The isolation and filtering continues until the signal is supplied via connection 176 to the demodulator 178 for further processing.

Figure 11:
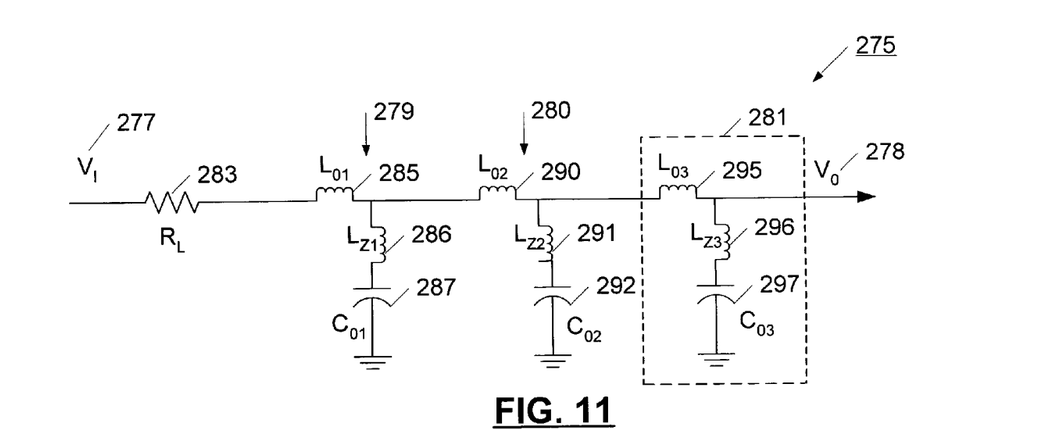
FIG. 11 is a circuit diagram of a higher order passive filter network.

Referring now to FIG. 11, a more complex passive filter arrangement 275 is illustrated that is designed for sharper filter selectivity. Selectivity is generally a measure of how rapidly a filter transitions between a passband frequency region and a stopband frequency region. To achieve greater selectivity in a filter, it is useful to increase the number of poles, or orders, in the transfer function, which generally requires the use of more reactive devices. The passive filter 275 is a sixth order filter, with the inductors $L_{On}$ (285, 290, and 295) cooperating with capacitors $C_{On}$ to provide 6 poles in the transfer function. More particularly, the poles are configured to provide an elliptical constellation in pole-zero configuration. Passive filter 275 is commonly referred to as a ladder filter, which allows loading effects between filter stages. The selection of a filter topology is well known, so will not be discussed in detail. For example, common filter designs such as the Butterworth or Chebyshev are well known topologies that provide multiple-pole constellations with good selectivity. It is also known in the filter arts that selectivity may be improved by designing a filter to also have zeros in its pole plot. Adding zeros may degrade the linearity of the filter, but the additional non-linearity may be compensated for in other parts of the circuit. For example, the non-linearity may be handled in the digital domain by digitizing and scaling the output from the filter. It will be appreciated that other circuitry may be used to compensate of non-linearity introduced by the addition of zeros. In passive filter 275, the inductors $L_{Zn}$ add zeros into the transfer function, and thereby increase the selectivity characteristics for the filter. The filter 275 has three filter ladders 279, 280, and 281. It will be understood that more or fewer ladders may be used for specific applications and to meet particular design goals. For example, if filter ladder 281 is not used, then filter 275 becomes a $4^{th}$ order filter, which may provide sufficient selectivity for many applications. Since the filter also provides zeros, it offers superior selectivity, although the added non-linearity will need to be handled or accounted for in other circuit elements.

Figure 12:
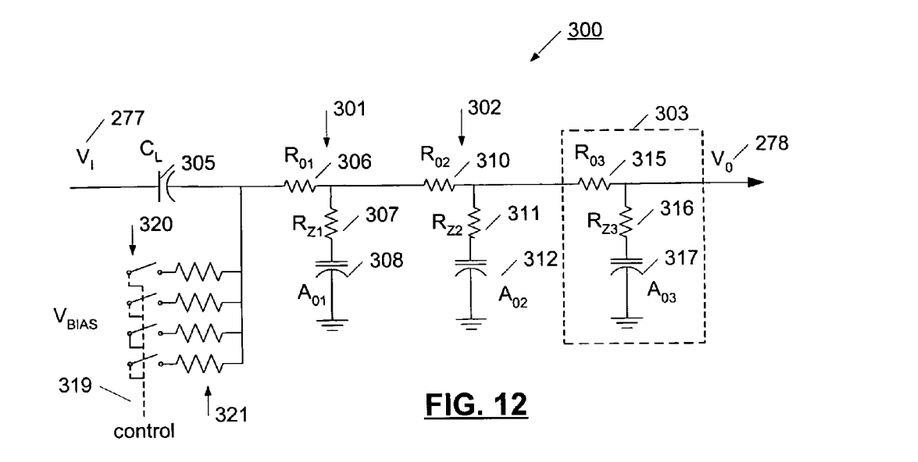
FIG. 12 is a is a circuit diagram of a low-noise filter in accordance with the present invention.

In FIG. 12, the design process 80 discussed with reference to FIG. 7 is applied to the passive filter 275 to generate an active filter 300. In applying the process 80, a Bruton transform is performed on the passive filter. In this way the load resistor 283 of the passive filter is converted to a load capacitor 305 in the active filter; inductors 285, 286, 290, 291, 295 and 296 of the passive filter are converted to resistors 306, 307, 310, 311, 315, and 316 in the active filter; and capacitors 287, 292, and 297 of the passive filter are converted to "super capacitors" 308, 312, and 317 in the active filter, which may be implemented as FDNR devices. It will be appreciated that in applying the Bruton transformation the filter designer may choose constants and impedance scaling factors to meet specific design goals, for example, to make the capacitors as small as practical while maintain good filter selectivity and low noise characteristics. After transformation and selection of component values, the active filter 300 has a filter transfer function similar to the transfer function of the passive filter 275. The filter 300 has a first filter block 301, a second filter block 302, and a third filter block 303. It will be understood that if filter ladder 281 was removed from the passive filter 275, then filter block 303 would not be used.

A set of bias resistors 321 are coupled between the output of load capacitor 305 and the input to the FDNR 308. The bias resistors 321 cooperate with other circuit components to set a high-pass cutoff frequency so that the filter 300 blocks or cancels any DC offset present at the input signal line 277. In this way, the output signal 278 is a filtered signal free of DC offset effects. The bias resistors 321 are connected to a set of switches 320 capable of changing bias resistance according to a control signal received on control line 319. In this way, the bias may be adjusted to allow the filter to settle faster or to change high-pass cutoff frequency. For example, at startup, the resistance may be set to an initial value to allow the filter 300 to settle to a steady-state condition, and the resistance changed to set a more desirable high-pass cutoff frequency.

In one implementation, the filter topology of filter 300 may be directly taken to a final design. For example, the FDNR devices 308, 312, and 317 may be constructed as GIC devices, and the entire topology disposed on an integrated circuit or built using more discreet technology. However, since filter 300 is arranged as a ladder filter, there will be loading between filter blocks. For example, the components and circuit activity in filter block 302 will interact with the components and circuit activity of filter block 301. In this way, the cross-filter loading must be considered when selecting component values, which complicates selecting component values for the filter design. This loading action is well known, and commonly available engineering texts provide filter topologies with values selected to account for loading. In this way, a designer is able to more readily select components for a ladder filter, such as ladder filter 300.

Figure 13:
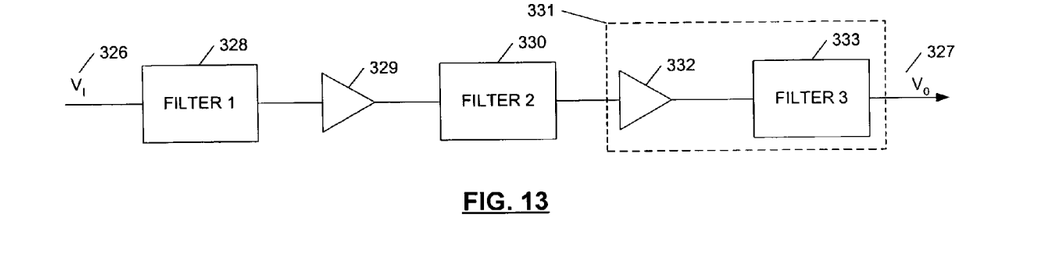
FIG. 13 is a block diagram of a filter chain implementing a low noise filter in accordance with the present invention.

In another implementation, the filter topology of filter 300 may be modified into a chain of isolated filter stages. As shown in FIG. 13, an input signal 326 is applied to a first filter stage 328. An isolation amplifier 329 isolates the output of filter stage 1 328 from the effects of filter stage 2 330. In a similar manner, if a third filter bank stage 331 is needed, then an isolation amplifier 332 isolates the output of filter stage 2 330 from the effects of filter stage 3 333. In one embodiment, the isolation amplifiers may be constructed with operation amplifiers. It will be understood that other isolation structures may be used to eliminate or reduce loading effects. Each of the filter stages 328, 330, and 333 correspond to filter blocks 301, 302, and 303 of filter 300. Each of the filter blocks 301, 302, and 303 may be implemented using a GIC device, which acts to add a single pair of poles to the filter's transform function. In this way, the components for each filter stage are selected to set a specific pair of poles (and possibly one or more zeros), without concern for loading effects, since the isolation amplifiers 329 and 332 block the loading effects. By isolating each filter stage, the design and tuning of a filter topology may be eased, but this topology uses additional active devices for isolation. Therefore, the direct ladder implementation may still be desirable for some applications.

Figure 14:
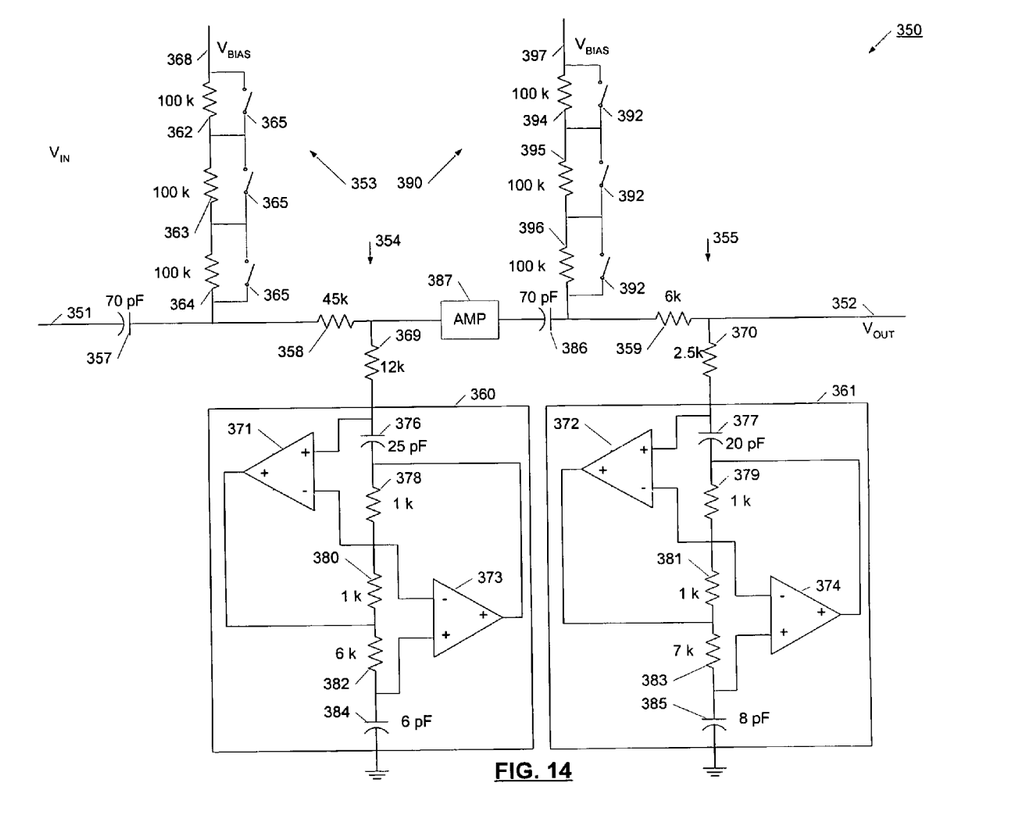
FIG. 14 is a circuit diagram of a CDMA low noise filter in accordance with the present invention.

Referring now to FIG. 14, a low noise filter 350 is illustrated in schematic form. Low noise filter 350 was designed according to the process 80 described with reference to FIG. 7. Low noise filter 350 has been designed for use in a CDMA receiver chain, so the specific component values have been selected for that implementation. It will be understood that other component values may be selected to implement different design goals. Also, the specific CDMA design goals could be met using a forth ordered filter, so only two filter stages 354 and 355 are used. Further, to ease initial selection of component values and to allow for easier tuning, the filter stages are isolated to eliminate or substantially reduce any loading effects between stages. In this way, the components of filter stage 354 have been selected to add a specific pair of poles and a zero to the transfer function, and the components of filter stage 355 have been selected to add another specific pair of poles and a zero to the transfer function. It will be appreciated that the topology and component values may be adjusted to meet other design goals and to support other communication standards.

In filter 350, an input signal is received on input line 351, which couples to a load capacitor 357. The input signal may be, for example, an unfiltered baseband signal from a down-converter. In this way, the unfiltered baseband signal has frequency components that need to filtered out, and the signal also is likely to have an undesirable DC offset. A set of bias resistors 362, 363, and 364 is coupled between the output of a load capacitor 357 and a GIC device 360, and receives a bias voltage 368. These bias resistors and the load capacitor 357 comprise a circuit section 353. The set of bias resistors also have switches 365 which are controllable to change the bias resistance, and therefore change the applied bias. In this way, the settling time and high pass cutoff frequency for the circuit section 353 may be adjusted. The circuit section 353 is useful to set a high pass cutoff frequency for blocking or canceling the DC offset in the input signal. It will be understood that circuit section 353 may be adjusted to block or cancel all or substantially all of the DC offset, or may be adjusted to allow some DC offset effect to pass.

The filter stage 354 includes the load capacitor 357, which couples to resistor 358. Resistor 358 provides the output from filter stage 354 into isolation amplifier 387. A resistor 369 is connected to the output of resistor 358, which is used to add a zero to the transfer function. The addition of this zero acts to improve filter selectivity, but will add a non-linear effect that will be accounted for in subsequent circuitry or processing. A frequency dependant negative resistance (FDNR) device 360 couples to the output of the resistor 369. The FDNR device 360 receives the baseband signal after the DC offset effects have been handled, so there is a reduced risk of saturating or damaging any component. In filter 350, the FDNR is implemented as a general impedance converter (GIC) 360. The GIC 360 implements a bi-quad filter section that adds a pair of poles to the transfer function. The GIC 360 includes a pair of operational amplifiers (op-amps) 371 and 373, and related capacitances and resistances. The non-inverting input of the operational amplifier 371 is coupled to the node between the resistance 369 and capacitance 376, while the inverting input of the operational amplifier 371 is coupled to the inverting input of the operational amplifier 373. The non-inverting input of the operational amplifier 373 is coupled to the node between the capacitance 384 and the resistance 382. The output of the operational amplifier 371 is coupled to the node between the resistances 380 and 382. The output of the operational amplifier 373 is coupled to the node between the capacitance 376 and the resistance 378. It will be appreciated that other circuit arrangements may be used to implement a GIC or FDNR.

The load capacitor 357 is part of the circuit section 353, as well as the filter stage 354. As part of the circuit section 353, the load capacitor 357 cooperates with other circuit elements to block DC offset, and as part of the filter stage 354, the load capacitor 357 cooperates with other circuit elements to define the filter transfer function. In this way, the load capacitor 357 is shared to both block DC offset and to filter the input signal.

The isolation amplifier 387 blocks or substantially reduces any loading effects between the first filter stage 354 and the second filter stage 355. The output of the isolation amplifier 387 is received into load capacitor 386. A set of bias resistors 394, 395, and 396 is coupled between the output of load capacitor 386 and a GIC device 361, and receives a bias voltage 397. These bias resistors and the load capacitor 386 comprise a circuit section 390. The set of bias resistors also have switches 392 which are controllable to change the bias resistance, and therefore change the applied bias. In this way, the settling time and high pass cutoff frequency for the circuit section 390 may be adjusted. The circuit section 390 is useful to set a high pass cutoff frequency for blocking or canceling any remaining DC offset in the signal.

The filter stage 355 includes the load capacitor 386, which couples to a resistor 359. The resistor 359 also provides the output 352 from filter 350. The output signal 352 may be received, for example, by a demodulator or other baseband receiver circuitry, and may also include an isolation device to block loading effects from the follow-on circuitry. A resistor 370 is connected to the output of resistor 359, which is used to add a zero to the transfer function. The addition of this zero acts to improve filter selectivity, but will add a non-linear effect that will be accounted for in subsequent circuitry or processing. A frequency dependant negative resistance (FDNR) device 361 couples to the output of the resistor 370. In filter 350, the FDNR is implemented as a general impedance converter (GIC) 361. The GIC 361 implements a bi-quad filter section that adds another pair of poles to the transfer function. The GIC 361 includes a pair of operational amplifiers (op-amps) 372 and 374, and related capacitances and resistances. The non-inverting input of the operational amplifier 372 is coupled to the node between the resistance 370 and capacitance 377, while the inverting input of the operational amplifier 372 is coupled to the inverting input of the operational amplifier 374. The non-inverting input of the operational amplifier 374 is coupled to the node between the capacitance 385 and the resistance 383. The output of the operational amplifier 372 is coupled to the node between the resistances 381 and 383. The output of the operational amplifier 374 is coupled to the node between the capacitance 377 and the resistance 379. It will be appreciated that other circuit arrangements may be used to implement a GIC or FDNR.

The load capacitor 386 is part of the circuit section 390, as well as the filter stage 355. As part of the circuit section 390, the load capacitor 386 cooperates with other circuit elements to block remaining DC offset, and as part of the filter stage 355, the load capacitor 386 cooperates with other circuit elements to define the filter transfer function. In this way, the load capacitor 386 is shared to both block DC offset and to filter the input signal.

Filter 350 is constructed using GIC devices 360 and 361, which enable excellent noise characteristics while permitting relatively small capacitors, including the load capacitors 357 and 386. The load capacitors have the shared function of cooperating with other components to block or cancel DC offset effects, as well as cooperating to set the network frequency response. In this way, the filter 350 can be constructed with relatively small capacitors, and without a separate structure of process to account for a DC offset.

While particular preferred and alternative embodiments of the present intention have been disclosed, it will be appreciated that many various modifications and extensions of the above described technology may be implemented using the teaching of this invention. All such modifications and extensions are intended to be included within the true spirit and scope of the appended claims.

What is claimed is:

1. A low-noise filter for receiving a downconverted signal, comprising:
    a signal path extending from an input line to an output line;
    a load capacitor in the signal path;
    a frequency dependent negative resistance (FDNR) device coupled to the signal path and cooperating with the load capacitor to define poles in a filter transfer function;
    a bias resistor coupled to the output of the load capacitor;
    a bias voltage source coupled to the bias resistor; and
    wherein the bias resistor and the bias voltage are used in setting a high cutoff frequency so that the load capacitor acts to block or cancel a DC offset in the downconverted signal.

2. The low noise filter according to claim 1 wherein the FDNR device is constructed in the form of a Generalized Impedance Component (GIC).

3. The low noise filter according to claim 2 wherein the GIC contributes a pole-pair to the low noise filter's transfer function.

4. The low noise filter according to claim 2 further including a resistor between the GIC and the signal path that contributes a zero to the low noise filter's transfer function.

5. The low noise filter according to claim 1 further including a second FDNR device coupled to the signal path.

6. The low noise filter according to claim 5 further including an isolation device between the FDNR and the second FDNR.

7. The low noise filter according to claim 1, further including:
    a second bias resistor;
    a switch connected to one of the bias resistors; and
    a control line connected to the switch so that the switched bias resistor is selectively coupled to the load capacitor.

8. A low IF receiver portion having at least one low-noise filter, comprising:
    an input line for receiving an RF signal;
    a down converter connected to the input line and having a low frequency output line, the down converter coupled to a local oscillator and arranged to generate a low frequency signal on the low frequency output line;

a low-noise filter coupled to the low frequency line, the low noise filter further including a capacitor arrangement and an FDNR device, wherein inclusion of the capacitor arrangement defines poles in a filter transfer function;

a bias resistor cooperating with the capacitor arrangement to form a DC blocking structure; and an output signal line extending from the low noise filter to a demodulator module.

9. The low IF receiver portion according to claim 8 wherein the down converter is arranged to generate a zero IF signal.

10. The low IF receiver portion according to claim 8 further including:

a filter stage contributing to a transfer function for the low noise filter; and wherein the capacitor arrangement is shared by the DC blocking structure and the filter stage.

11. An integrated circuit chip having active and passive components cooperating on a semiconductor substrate to perform a low noise filtering function, comprising:

an input line for receiving a signal; a capacitor block coupled to the input line and positioned on the integrated circuit chip;

an FDNR device cooperating with the capacitor block to add poles to a transfer function for the low noise filter; and a bias structure cooperating with the capacitor block to block or cancel DC offset in the signal.

12. The integrated circuit chip according to claim 11, wherein the FDNR device is constructed as a GIC device.

13. The integrated circuit chip according to claim 12, including:

a second GIC device to add poles to the transfer function; and an isolation device between the GIC and the second GIC.

14. Baseband circuitry, comprising:

an input line for receiving a filtered baseband signal;

control circuitry configured to operate on the filtered baseband signal, wherein the filtered baseband signal is generated according to the steps of:

providing an unfiltered baseband signal having unwanted frequency components and a DC offset;

filtering the unwanted frequency components using an FDNR device that cooperates with a capacitor to define poles in a filter transfer function; and blocking the DC offset using a capacitor.

15. The baseband circuitry according to claim 14, wherein generating the filtered baseband signal includes using a resistor to define a zero in the filter transfer function; and the baseband circuitry is constructed to account for nonlinearity introduced by the zero.

16. A low noise filter module for filtering a downconverted signal, comprising:

a signal path extending from an input line to an output line;

a load capacitor on the signal path;

a first filter stage coupled to the signal path and including a first FDNR device;

a second filter stage coupled to the signal path and including a second FDNR device;

bias circuitry coupled to the output of the load capacitor; and wherein the bias circuitry cooperates with the load capacitor to block or cancel a DC offset in the downconverted signal, and at least one of the first and second filter stages cooperates with the load capacitor to define poles in a filter transfer function.

17. The low noise filter module according to claim 16, wherein the first filter stage cooperates with the load capacitor to implement a desired filter transfer function for the low noise filter.

18. The low noise filter module according to claim 16, wherein the load capacitor is constructed to block the DC offset and to define a transfer function.

19. The low noise filter module according to claim 16, wherein the first FDNR device defines a first set of poles in a transfer function and the second FDNR device defines a second set of poles in the transfer function.

20. The low noise filter module according to claim 16, further including a resistor coupled to one of the FDNR devices that defines a zero in a transfer function for the low noise filter.

21. The low noise filter module according to claim 16, further including an isolation device positioned between the first filter stage and the second filter stage.

22. The low noise filter module according to claim 21 wherein the isolation device is constructed as an isolation amplifier.

* * * * *